US006819106B2

(12) United States Patent
Young et al.

(10) Patent No.: US 6,819,106 B2
(45) Date of Patent: Nov. 16, 2004

(54) MAGNETIC RESONANCE IMAGING APPARATUS WITH MEANS TO SCREEN RF FIELDS

(76) Inventors: Ian Robert Young, High Kingsbury, Kingsbury Street, Marlborough, Wiltshire SN8 1HZ (GB); Michael Charles Keogh, 3 The Brackens, High Wycombe, Bucks, HP11 1EB (GB)

( * ) Notice: Subject to any disclaimer, the term of this patent is extended or adjusted under 35 U.S.C. 154(b) by 0 days.

(21) Appl. No.: 10/220,732

(22) PCT Filed: Mar. 6, 2001

(86) PCT No.: PCT/GB01/00962

§ 371 (c)(1),
(2), (4) Date: Jan. 13, 2003

(87) PCT Pub. No.: WO01/67126

PCT Pub. Date: Sep. 13, 2001

(65) Prior Publication Data

US 2003/0155918 A1 Aug. 21, 2003

(30) Foreign Application Priority Data

Mar. 6, 2000 (GB) .............................. 0005354

(51) Int. Cl.⁷ ............................................... G01V 3/00
(52) U.S. Cl. ...................................................... 324/318
(58) Field of Search ......................................... 324/318

(56) References Cited

U.S. PATENT DOCUMENTS

| 4,439,733 A | * | 3/1984 | Hinshaw et al. | ............ 324/322 |
| 5,053,711 A | * | 10/1991 | Hayes et al. | ................ 324/318 |
| 5,363,845 A | | 11/1994 | Chowdhury et al. | |
| 5,386,191 A | * | 1/1995 | McCarten et al. | .......... 324/318 |
| 5,804,969 A | | 9/1998 | Lian et al. | |
| 5,910,728 A | | 6/1999 | Sodickson | |
| 6,043,658 A | * | 3/2000 | Leussler | ...................... 324/318 |
| 6,169,401 B1 | * | 1/2001 | Fujita et al. | ................ 324/318 |
| 6,441,615 B1 | * | 8/2002 | Fujita et al. | ................ 324/318 |
| 6,606,513 B2 | * | 8/2003 | Lardo et al. | ................ 324/318 |

FOREIGN PATENT DOCUMENTS

| EP | 0 880 311 A | 11/1998 |
| EP | 1 014 102 A | 6/2000 |
| WO | WO 98/21600 A1 | 5/1998 |
| WO | WO 00/41270 A1 | 7/2000 |
| WO | WO 01/67549 A2 | 9/2001 |
| WO | WO 01/67550 A2 | 9/2001 |

OTHER PUBLICATIONS

Wiltshire M C K et al., "Microstructured magnetic materials for RF flux guides in magnetic resonance imaging" Science, Feb. 2, 2001, American Assoc. Adv. Sci. USA, vol. 291, No. 5505, pp. 849–851, XP002169173 ISSN: 0036–8075.

Pendry J B et al., "Magnetism From Conductors and Enhance Nonlinear Phenomena" IEEE Transactions on Microwave Theory and Techniques, US, IEEE Inc. New York, vol. 47, No. 11, Nov. 1999, pp. 2075–2084, XP000865104, ISSN: 0018–9480.

Burl M et al: "Examples of the Design of Screened and Shielded RF Receiver Coils", Magnetic Resonance in Medicine, US, Academic Press, Duluth, MN, vol. 36, No. 2, Aug. 1, 1996, pp. 326–330, XP000625808, ISSN: 0740–3194, figures 2,3.

* cited by examiner

Primary Examiner—Christopher W. Fulton
(74) Attorney, Agent, or Firm—Venable LLP; Catherine M. Voorhees

(57) ABSTRACT

In magnetic resonance imaging apparatus, an array of coils (7, 8, 9, 10) is used to receive magnetic resonance signals from a desired region of a patient. Screens 11 to 13 and 14 and 15 are provided between the coils and at the ends of the array of coils to control the sensitive region A of each coil but, in accordance with the invention, the screening properties of the screens is controllable so that for example the screens may be made inoperative beneath the plane of the array of coils so that each has the field of view B, in order to vary the properties produced by the array. Other uses of screens are described.

12 Claims, 3 Drawing Sheets

MAGNETIC RESONANCE IMAGING APPARATUS WITH MEANS TO SCREEN RF FIELDS

BACKGROUND OF THE INVENTION

This invention relates to magnetic resonance imaging.

A typical magnetic resonance imaging apparatus is shown in FIG. 1. A patient 1 on a couch 2 is slid into the bore 3 of an annular electromagnet, typically a superconducting electromagnet. A main magnetic field is generated in alignment with the axis of the bore, and gradient coils (not shown) are provided to set up magnetic field gradients for example along the z-direction along the axis of the bore, and along x and y directions in the radial plane. A transmit coil 4 surrounds the patient and transmits pulses of r.f. energy to excite to resonance magnetic resonance active nuclei such as protons in the region of the patient to be examined. This transmit coil 4 is normally surrounded by an r.f. shield coil 5 to shield the bore 3 of the electromagnet from extraneous unwanted r.f. signals. The transmit coil 4 can be also be used to receive the magnetic resonance signals which result from the resonating protons in the region of interest, although a separate receive coil is often provided. For many examinations, a coil placed in the vicinity of the surface of the patient is used to receive the magnetic resonance signals, such as the coil 6 (shown on an enlarged scale in FIG. 2).

To increase the signal-to-noise ratio, it has been proposed to use an array of coils in the vicinity of the surface of the patient, for receive purposes. There are various reasons for this, all of which usually stem from a desire to reduce the scanning time required to build up an image of the region of interest of the patient.

Thus, it could be that the sensitive region of each coil of the array matches better the region it is desired to image than would one large receive coil, and more signal can therefore be collected from the region of interest. It could also be that the localised view of the region it is desired to image obtained from each coil of the array can be used to advantage to reduce the number of encoding steps (WO-A-98/21600 and European Patent Application No. 1 014 102).

In many cases, it would be desirable to separate adjacent coils of the array by means of screens. The field of view of each coil is then more precisely defined.

The applicants are aware that microstructures with magnetic properties comprising an array of capacitive elements made from non-magnetic conducting material can exhibit magnetic permeability at radio frequencies (IEEE Transactions on Microwave Theory and Techniques, Vol. 47, No. 11, November 1999, Magnetism from Conductors and Enhanced Non-Linear Phenomena by J B Pendry, A J Holden, D J Robbins and W J Stewart, and International Patent Application WO-A-00/41270).

SUMMARY OF THE INVENTION

The invention provides magnetic resonance apparatus, in which resonance is excited in use in magnetic resonant active nuclei in a region of an object in the presence of a main magnetic field, which magnetic resonance apparatus includes a structure with magnetic properties forming a screen to screen r.f. flux, the structure comprising an array of capacitive elements, the array exhibiting a predetermined magnetic permeability in response to incident electromagnetic radiation lying within a predetermined frequency band, wherein each capacitive element includes a conducting path and is such that a magnetic component of the electromagnetic radiation lying within the predetermined frequency band induces an electrical current to flow around said path and through said associated element, wherein the spacing of the elements is less than the wavelength of the radiation within the predetermined frequency band, and wherein the size of the elements and their spacing apart arm selected such as to provide a magnetic permeability appropriate to that of a screen to electromagnetic radiation in that predetermined frequency band.

This enables the field of view of each coil, and the properties of the array as a whole, to be varied Such material is described in the IEEE article and in the International Patent Application WO-A-00/41270 referred to, the latter being incorporated herein by reference.

Preferably, at least one dimension of each capacitive element is less than the wavelength corresponding to the frequency of electromagnetic radiation exciting magnetic resonance.

The spacing of the elements may be less than one half, preferably less than one fifth of the wavelength of the radiation at the magnetic resonance frequency. Further advantages may flow from making the element spacing less than one tenth, or less than one hundredth of the wavelength of the radiation at the magnetic resonance frequency.

The screen may be capable of exhibiting a magnetic permeability having a zero or negative real part to electromagnetic radiation within the predetermined frequency band. The screen may be capable of being switched between this value, and the permeability of free space.

The screens of the structure with magnetic properties are however capable of use for any purpose in magnetic resonance apparatus, which may be magnetic resonance imaging apparatus or magnetic resonance spectroscopy apparatus, since the screens are non-magnetic in a steady magnetic field.

The screen will typically be tuned to the magnetic resonance frequency, but could be tuned to one or more different frequencies, for example, if it was desired to prevent interference of a particular external r.f source with a magnetic resonance experiment.

The invention also provides magnetic resonance apparatus, in which resonance is excited in use in magnetic resonant active nuclei in a region of an object in the presence of a main magnetic field, which magnetic resonance apparatus includes the said microstructured magnetic material to shield the region from extraneous r.f. energy.

The invention also provides magnetic resonance imaging apparatus, in which resonance is excited in use in magnetic resonant active nuclei in a region of an object in the presence of a main magnetic field, which magnetic resonance imaging apparatus includes the said microstructured magnetic material to shield regions of the object it is not desired to image from r.f. excitation applied to the region it is desired to image.

BRIEF DESCRIPTION OF THE DRAWINGS

Ways in which the invention may be carried out will now be described in detail, by way of example, with reference to the accompanying drawings, in which.

Like reference numerals have been given to like parts throughout the drawings.

DETAILED DESCRIPTION OF THE INVENTION

Figure 1:
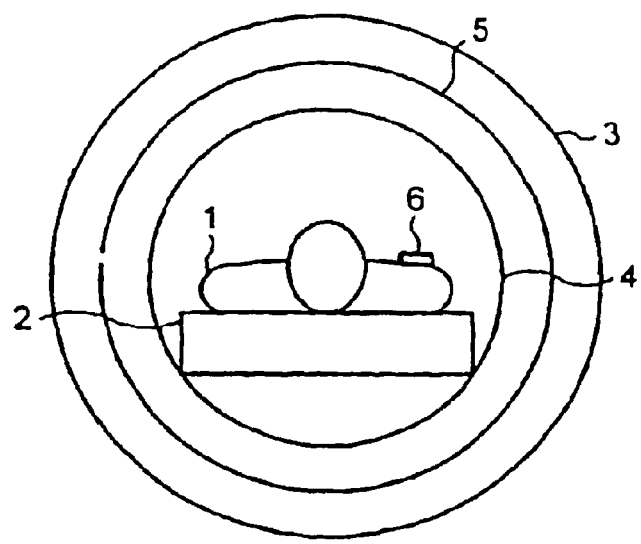
FIG. 1 is a schematic end view of part of known magnetic resonance imaging apparatus.

Referring to the drawings, the receive coil arrays shown in FIGS. 2 to 5, FIGS. 6 to 8, and FIG. 9 are intended to be used as the receive coil 6 in the known magnetic resonance imaging apparatus of FIG. 1.

Figure 2:
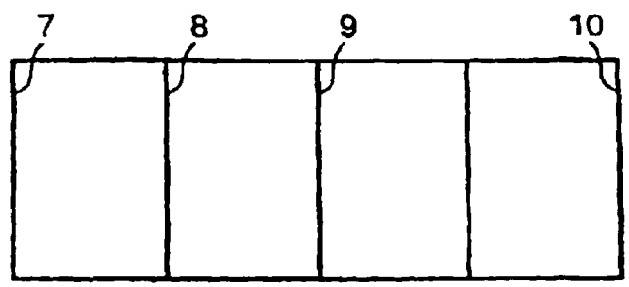
FIG. 2 is a plan view of a first embodiment of an r.f. receive coil array suitable for use in the known magnetic resonance imaging apparatus, in accordance with the invention.
Figure 3:
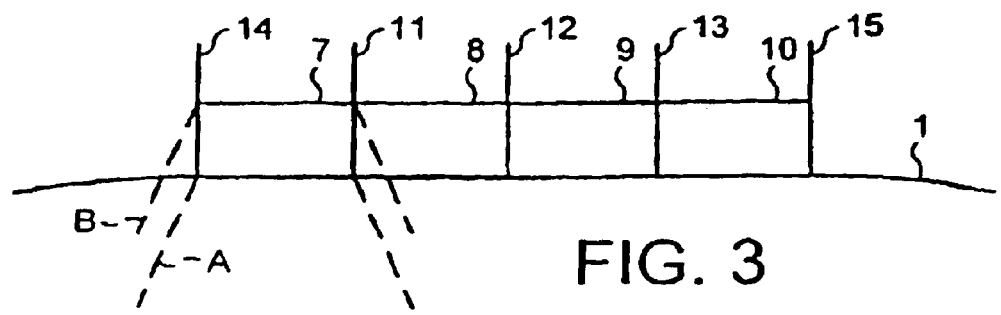
FIG. 3 is a front view of the receive coil array as shown in FIG. 2.

In the first embodiment of receive coil array (FIGS. 2 to 5), the receive coil 6 comprises an array of four coils 7, 8, 9, 10 which are spaced from each other by respective vertically arranged (as seen in FIG. 3) screens 11, 12, 13, with further screens 14 and 15 being positioned at the ends of the array. In side view, looking in a direction along the length of the array, each screen is of the form shown in FIG. 4.

Each receive coil 7 to 10 is connected to a separate channel of processing means for the magnetic resonance imaging apparatus, and the outputs of the four coils are combined in known ways.

Arrays of receive coils are of course known but, while screens have also been used between the coils of the array, the coils would have been mounted on the surface of the patient.

The field of view of each coil is indicated by the dotted lines indicated by the reference A, and the combination of the signals from the four coils can be used to obtain an image of a region inside the patient 1.

The screening properties of the screens 11 to 15 are controllable. Thus, each of the screens 11 to 15 is switchable so that it either acts as a conventional screen, or it acts as if there is no screen present. In the latter case, the field of view of each coil is now given by the dotted lines indicated with reference B, and this corresponds to the signal from a different region of the patient being collected.

To achieve the screening properties, the screens 11 to 15 are advantageously made of microstructures comprising an array of capacitive elements made from non-magnetic conducting material which exhibits magnetic permeability at radio frequencies, while being non-magnetic in steady magnetic fields, as described in the IEEE paper, International Patent Application WO-A-00/41270 and co-pending United Kingdom Patent Application No. 0005356.1. Screening will take place when the real part of the magnetic permeability of the microstructured material is zero or negative, for then there exists no solutions to Maxwell's equations. This condition is met for a range of frequencies lying between the frequency at which the microstructured material has a magnetic permeability having a resonant variation which diverges at an angular resonant frequency $\omega_0$, and a magnetic plasma frequency $\omega_0$ at which the effective magnetic permeability is equal to zero. This is explained with reference to FIG. 3 of the International Patent Application WO-A-00/41270.

The screening properties are controllable by the incorporation of switchable permitivity materials into the structured magnetic materials, as described in the International Patent Application WO-A-00/41270, and in our co-pending United Kingdom Patent Application No. 0005356.1.

The screens 11 to 15 may be controlled so as to be switchable between an operative state having a negative or zero real permeability (the imaginary component of permeability could be any value for negative real permeability and could be a high value for zero real permeability) and an inoperative state in which the real permeability is greater than or equal to unity, both conditions applying at the magnetic resonance frequency. For the screen to be totally transparent to r.f flux, the real permeability would be unity, but there could be advantages in the real permeability being in excess of unity.

The screens are not affected by the main magnetic field or gradient fields in any of its states, operative or inoperative; that is, the screen is non-magnetic i.e. has the magnetic permeability of free space i.e. a relative permeability of unity in those conditions.

Figure 4:
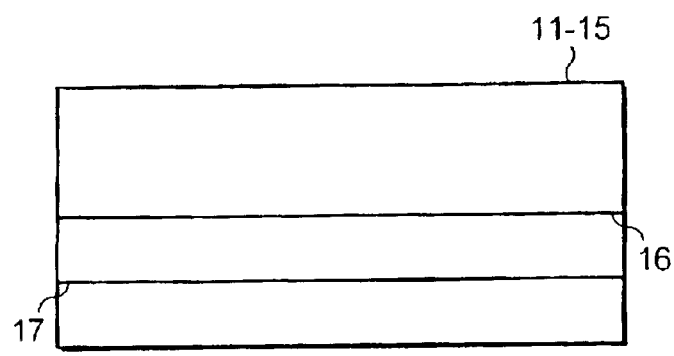
FIG. 4 is a side view of the screens of the receive coil array of FIGS. 2 and 3.

Referring to FIG. 4, the screens can be controlled so that the screening property is always maintained above the line 16, but can be switched on and off below the line 16. If desired, a separately switchable section 17 may be provided, so that the section above the line 16 acts as a screen, and the sections between the lines 16 and 17, and below the line 17, respectively, are individually switchable between operative (screening) and inoperative states. This would provide a third area of coverage from the two areas A, B shown in FIG. 3.

Figure 5:
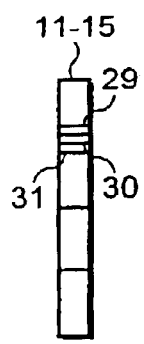
FIG. 5 is an end view of the screens of the receive coil array, with the thickness of the screens being exaggerated.

In one implementation, the screens could be made of rolls of non-magnetic conductor on an insulating substrate, such as 29, 30, 31 in FIG. 5. The rolls extend from face to face of the screen i.e. normal to the surface of each screen, and are closely packed together. Only a few sample rolls are shown in FIG. 5. The dimensions of the rolls and their spacing is chosen to provide zero or negative real part of refractive index. Magnetic flux which threads along the axes of the rolls is absorbed (zero real permeability) or reflected (negative real permeability), so that flux from signal sources in the patient is only received from field of view A in FIG. 3 when the screens are operative, since flux impinging on the outer surfaces of the screens on each side of coil 7 cannot couple with coil 7. When the screens are inoperative, such flux can couple with coil 7 to give field of view B. Instead of rolls, the capacitive elements could be formed by columns of planar elements.

Figure 6:
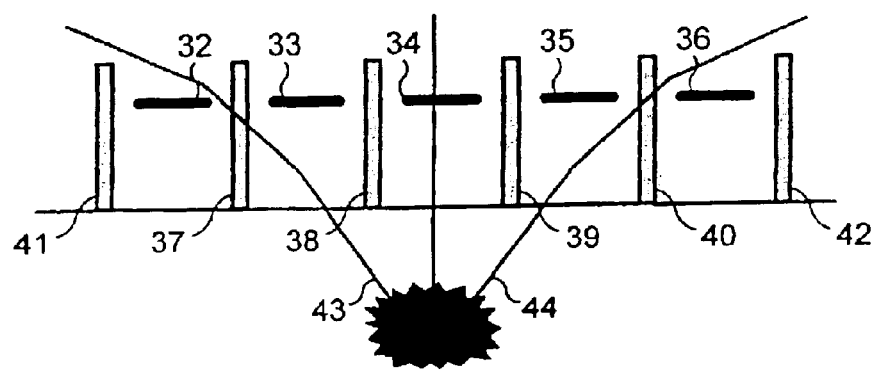
FIG. 6 is a front view of a second embodiment of a receive coil array suitable for use in the magnetic resonance imaging apparatus according to the invention.

In another implementation, an array of five coils 32–36 is screened by four screens 37–40 with a further two screens 41, 42 on the ends of the array, seen in FIG. 6 in a view corresponding to that of FIG. 3. The perspective views of the alternative forms of screens shown in FIGS. 7 and 8 are not drawn to scale.

The screens block the transverse component of the r.f. flux such as 43, 45: that reduces the field of view and prevents the coils from coupling. To restrict the field of view (fov), the component of the flux that is normal to the plane of the screens 37–40 must be prevented from crossing from one coil to another. This means that the component of the permeability of the screens in a direction normal to their faces must be controlled. The components of the permeability of the screen in orthogonal directions, that is, in the plane of the screens, are not switchable. So the orientation of the material needs to be shown in FIGS. 7 and 8. In both cases, the axis of the structure needs to be normal to their faces, transverse to the axes of the coils 32–36.

Figure 7:
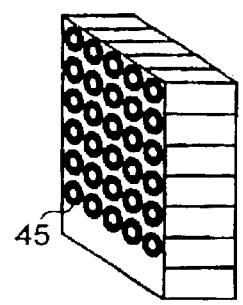
FIG. 7 is a perspective view of a first form of screen suitable for use in the array of FIG. 6.
Figure 8:
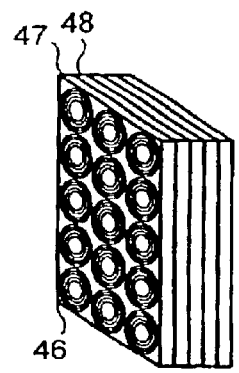
FIG. 8 is a perspective view of a second form of screen suitable for use in the array of FIG. 6.

FIG. 7 shows each screen in perspective view, with rolls of non-magnetic conductor on an insulating substrate, such as 45, similar to the rolls 29 to 31 of FIG. 5. The rolls extend from face to face of the screen 4. A switchable dielectric e.g. BST paint could be used between conducting layers. This would; reduce the resonant frequency so that the region with $\mu<0$, which lies above the resonant frequency, was now at the operating frequency. When switched, the resonant frequency is increased, and $\mu$ becomes positive again.

For ProFilm (Trade Mark) (Mylar (Trade Mark) base coated with 10 nm of aluminium and a glue layer to give a total film of about 50 $\mu$m thickness, sheet resistance about 2.7 Ω/square), 50 turns are wound on an 8 mm mandrel giving an outside diameter of 12.6 mm, a resonant frequency of 22.0 MHz, a plasma frequency of 72.2 MHz, and a most negative value of magnetic permeability of $\mu=-2.1$.

For Superinsulation (Trade Mark) (6.41 $\mu$m thick Mylar (Trade Mark) with 50 nm aluminium film; sheet resistance about 0.5 Ω/square), 20 turns on a 6 mm mandrel gives an outside diameter of 6.26 mm, a resonant frequency of 20.3 MHz, a plasma frequency of 66.4 MHz, and a most negative permeability of $\mu=-3.28$.

With a 50 $\mu$m interlayer, 50 turns on a 6 mm mandrel gives an OD of 11.6 mm, resonant frequency of 37.5 MHz, plasma frequency of 122.8 MHz, and most negative permeability of $\mu=-19$.

Using a silver coated film to increase the conductivity (reduce the sheet resistance to 0.1 Ω/square) in the previous example gives $\mu=-97.8$.

The materials (ProFilm (Trade Mark) and Superinsulation (Trade Mark)) may be assembled in hexagonal close packed lattices (i.e. as closely packed as possible).

In the alternative form of screens shown in FIG. 8, the screen is made from a number of printed circuit boards such as 47, 48. Each board carries an array of capacitive loops 46, which form columns of loops with the loops of the other boards. The columns extend normal to the faces of the screens. The elements may be spirals as described in our co-pending United Kingdom Patent Application No. 0005356.1. Typical dimensions would be:

Number of turns=10

Internal diameter=5 mm

Outer diameter=18 mm

Track width=0.5 mm; inter-track gap=0.1 mm

Layer thickness=0.5 mm

The gaps may be filled with a switchable dielectric material (e.g. BST paint) with $\in=50$, continuously switchable to $\in=20$.

The permeability at 21.3 MHz is shown below

| $\in$ | $\mu$ | $\in$ | $\mu$ | $\in$ | $\mu$ |
|---|---|---|---|---|---|
| 50 | −1.57 + 0.01i | 46 | −101 + 15.7i | 40 | 2.42 + 0.003i |
| 49 | −2.33 + 0.016i | 45.9 | 280 + 531i | 20 | 1.16 + 10$^{-5}$i |
| 48 | −3.82 + 0.034i | 45 | 11.4 + 0.16i | | |
| 47 | −8.03 + 0.121i | 44 | 5.85 + 0.035i | | |

So by controlling the permittivity of the dielectric in the gaps, we can control the permeability over the whole range of interesting values.

The controllability of the screens enables the sensitivity profiles of the coils of the array to be reconfigured for different scanning operations. Further, the individual coil sensitivity profiles could be varied during the course of a scan to achieve improved performance.

The invention is not of course restricted to arrays of four coils or five coils as shown in FIGS. 2 and 3, and FIG. 6, respectively. The array may be larger, and multiple individually controlled screens between each segment would then permit a change both of the apparent size of coils, but also optimisation of the field of view of each coil so as to achieve maximal encoding gains as in WO-A-98/21600 and European Patent Application No. 1 014 102.

The coil shown in FIGS. 2 and 3, or FIG. 6 and larger or smaller versions similar thereto, may also be used for transmitting the r.f. excitation pulse for exciting resonance in magnetic resonant active nuclei, as well as for receiving the r.f. relaxation signals. By controlling the screens, it is possible to employ a different shape and size of r.f. field during transmission and during reception.

Figure 9:
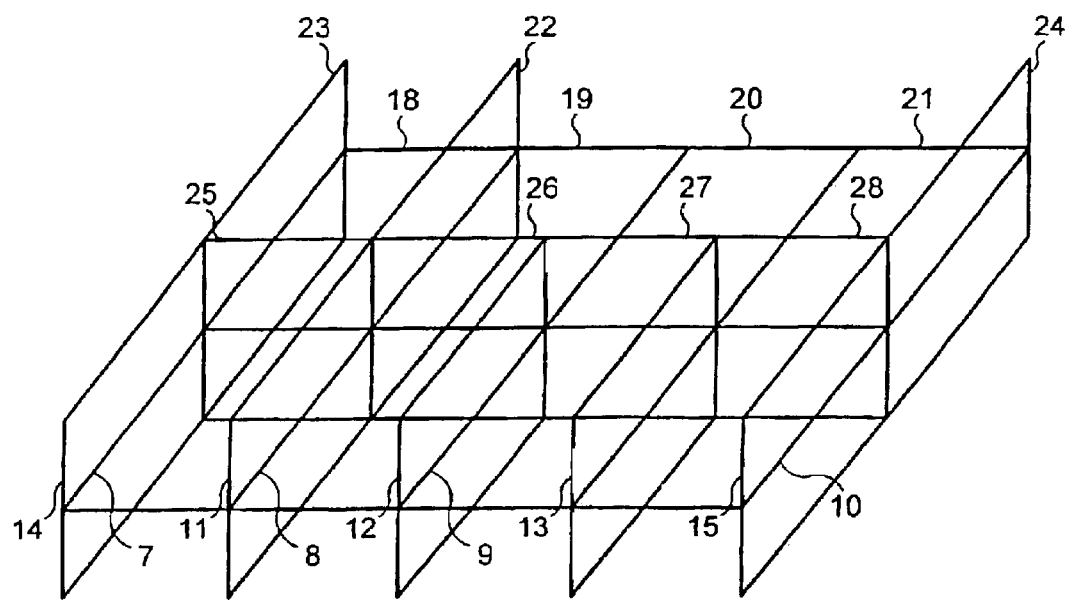
FIG. 9 is a perspective view of a third embodiment of receive coil array according to the invention.

In a further embodiment shown in FIG. 9, a further set of coils 18 to 21 is employed, separated by controllable screens only one of which 22 is shown, with end screens 23 and 24. In this case, however, separate screens 25 to 28 are employed between the two arrays themselves. The screens are all made of the same material as that described above.

If desired, flux guides could be provided to guide flux between the surface of the patient and the coils of the array, as described in our co-pending United Kingdom Patent Application No. 0005349.6, the contents of which are incorporated herein by reference.

The screens are not restricted to use between array coils. Thus, it is customary for the entire magnetic resonance apparatus to be housed in a copper clad room, to prevent external r.f. disturbances affecting the collection of data. The screens of microstructured material could be used for this purpose, and in this cases it is not necessary for the permeability to be controllable. The screen simply needs to reflect or absorb external r.f. energy at the magnetic resonance frequency. The microstructured material could form a lining for the room housing the magnetic resonance apparatus.

In another application, the microstructured material can be used to prevent aliasing. This arises when the r.f. excitation pulses excite regions of an object e.g. a patient outside the desired region, so that the data collected comes partly from this region and partly from the unwanted region. The screen of microstructured material is draped over the unwanted region, and shields it from the r.f. excitation pulses. Aliasing is thus reduced or eliminated.

While the magnet is an electromagnet in FIG. 1, the invention is also applicable to open magnets such as permanent magnets. The screen may be non-magnetic in audio-frequency magnetic fields.

What is claimed is:

1. Magnetic resonance apparatus, in which resonance is excited in use in magnetic resonant active nuclei in a region of an object in the presence of a main magnetic field, which magnetic resonance apparatus includes a structure with magnetic properties forming a screen to screen r.f. flux, the structure comprising an array of capacitive elements, the array exhibiting a predetermined magnetic permeability in response to incident electromagnetic radiation lying within a predetermined frequency band, wherein each capacitive element includes a conducting path and is such that a magnetic component of the electromagnetic radiation lying within the predetermined frequency band induces an electrical current to flow around said path and through said associated element, wherein the spacing of the elements is less than the wavelength of the radiation within the predetermined frequency band, and wherein the size of the elements and their spacing apart are selected such as to provide a magnetic permeability having a zero or negative real part to electromagnetic radiation of a frequency within the predetermined frequency band.

2. Magnetic resonance apparatus as claimed in claim 1, in which the screen is arranged to screen the region in which resonance is excited in use from extraneous r.f. energy.

3. Magnetic resonance apparatus as claimed in claim 1, in which the screen is arranged to screen regions of the object it is not desired to image from r.f. excitation applied to the region it is desired to image.

4. Magnetic resonance apparatus as claimed in claim 1, including an array of coils for receiving magnetic resonance signals generated by the magnetic resonant active nuclei, in which the screen is arranged between coils of the array.

5. Magnetic resonance apparatus as claimed in claim 1, in which the screening properties of the screen are controllable.

6. Magnetic resonance apparatus as claimed in claim 5, including a switchable permittivity material associated with the capacitive elements to enable the magnetic permeability of the screen to be switched between different values.

7. Magnetic resonance apparatus as claimed in claim 1, in which the capacitive elements are rolls of conducting material arranged with their axes normal to the surface of the screens.

8. Magnetic resonance apparatus as claimed in claim 1, in which the capacitive elements are planar rings or spirals arranged in respective columns arranged with their axes normal to the surface of the screens.

9. Magnetic resonance apparatus as claimed in claim 1, in which the spacing of the elements is less than one half of the wavelength of the radiation at the magnetic resonance frequency.

10. Magnetic resonance apparatus as claimed in claim 1, in which the spacing of the elements is less than one fifth of the wavelength of the radiation at the magnetic resonance frequency.

11. Magnetic resonance apparatus as claimed in claim 1, in which the spacing of the elements is less than one tenth of the wavelength of the radiation at the magnetic resonance frequency.

12. Magnetic resonance apparatus as claimed in claim 1, in which the apparatus is magnetic resonance imaging apparatus.

* * * * *